(12) United States Patent
Chang (10) Patent No.: US 6,252,288 B1
(45) Date of Patent: Jun. 26, 2001

(54) HIGH POWER TRENCH-BASED RECTIFIER WITH IMPROVED REVERSE BREAKDOWN CHARACTERISTIC

(75) Inventor: Hsueh-Rong Chang, Thousand Oaks, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

(21) Appl. No.: 09/232,787

(22) Filed: Jan. 19, 1999

(51) Int. Cl.$^7$ .................. H01L 27/095; H01L 29/47; H01L 29/861
(52) U.S. Cl. .............. 257/471; 257/475; 257/481
(58) Field of Search .................... 257/107, 104, 257/106, 471, 481, 480, 482, 603, 656, 475

(56) References Cited

U.S. PATENT DOCUMENTS 4,982,260   1/1991   Chang et al. .................. 357/38

OTHER PUBLICATIONS

B. Jayant Baliga, Power Semiconductor Devices, PWS Publishing Company20 Park Plaza, Boston, MA 02116–4324, Chapter 4, pp. 153–154, pp. 187–192, Chapter 10, pp. 575–577, 1996.

*Primary Examiner*—Steven Loke
(74) *Attorney, Agent, or Firm*—Koppel & Jacobs (57) ABSTRACT

A high power rectifier device has an $N^-$ drift layer on an $N^+$ layer. A number of trench structures are recessed into the drift layer opposite the $N^+$ layer; respective mesa regions separate each pair of trenches. Each trench structure includes oxide side-walls, a shallow $P^+$ region at the bottom of the trench, and a conductive material between the top of the trench and its shallow $P^+$ region. A metal layer contacts the trench structures and mesa regions, forming Schottky contacts. Forward conduction through both Schottky and $P^+$ regions occurs when the device is forward-biased, with the Schottky contact's low barrier height providing a low forward voltage drop. When reversed-biased, depletion regions around the shallow $P^+$ regions and the side-walls provide a potential barrier which shields the Schottky contacts, providing a high reverse blocking voltage and reducing reverse leakage current.

18 Claims, 7 Drawing Sheets

HIGH POWER TRENCH-BASED RECTIFIER WITH IMPROVED REVERSE BREAKDOWN CHARACTERISTIC

BACKGROUND OF THE INVENTION

1. Field of the Invention

This invention relates to the field of high power rectifiers.

2. Description of the Related Art

Semiconductor devices are increasingly required to accommodate high currents and/or high voltages without failing. For example, a variable speed pulse-width modulated (PWM) motor control circuit typically employs a number of transistors as switches, each of which has a flyback rectifier connected across it; the switches are closed in sequence to provide variable frequency AC power to a motor. The rectifier in this type of application is required to conduct a large current when forward-biased, and to block a high voltage when reverse-biased. To maximize the efficiency of the control circuit, the flyback rectifier ideally has a low forward voltage drop $V_{FD}$. The rectifier should also have a small stored charge $Q_n$, to increase switching speed, and a "soft" recovery with a small peak reverse current $I_{RP}$, to reduce the stress on the associated switching devices.

Figure 1:
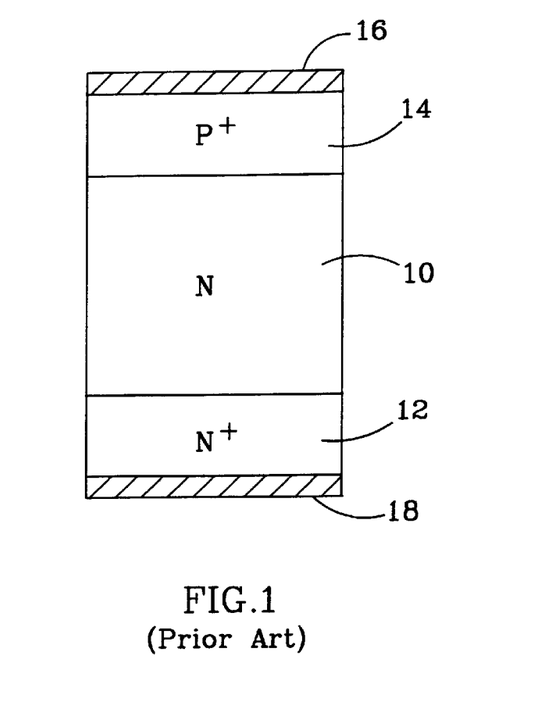
FIG. 1 is a sectional view of a P-i-N rectifier known in the prior art.

A number of power rectifier devices have been used to provide the high current and reverse blocking characteristics needed for such a high power application. One such device, the P-i-N rectifier, is shown in FIG. 1. An N-type drift layer 10 is between an N$^+$ layer 12 and a P$^+$ layer 14 (X$^+$ denotes a carrier concentration of at least $1 \times 10^{18}/cm^3$, X$^-$ denotes a carrier concentration of less than $5 \times 10^{16}/cm^3$). Metal on the P$^+$ and N$^+$ regions provide the rectifier's anode 16 and cathode 18, respectively.

When forward-biased, P$^+$ region 14 injects large numbers of minority carriers into drift region 10, greatly lowering the resistance of the drift region and allowing the rectifier to carry a high current density. The P-i-N rectifier's drift region 10 is usually thick, resulting in a high "blocking voltage"; i.e., the reverse voltage which the rectifier can accommodate without breaking down. These characteristics make the P-i-N rectifier useful for high power applications.

The P-i-N rectifier has several drawbacks, however. As described in J. Baliga, *Power Semiconductor Devices*, PWS Publishing Co. (1996) at p. 153, the P-i-N rectifier suffers from a "forward voltage overshoot" phenomenon, in which its $V_{FD}$ at turn-on is higher than it is under steady-state conditions. This can be a serious problem in power circuit because the higher $V_{FD}$ may appear across the emitter-base junction of a bipolar transitor used as an active element and exceed its breakdown voltage.

Another drawback of the P-i-N rectivier is its poor reverse recovery characteristic—as described in Baliga (ibid.) at p. 154. Reverse recovery occurs when the rectifier is switched from its on-state to its reverse blocking state. To undergo this transition, the minority carrier charge stored in the drift region during forward conduction must be removed, which requires the injected minority carriers to recombine with majority carriers. During recombination, some reverse current flows through the device before eventually decaying to zero. Because so many holes are injected into the drift region during forward conduction, recombination proceeds slowly in a P-i-N rectifier and thereby produces a poor reverse recovery characteristic.

Figure 2:
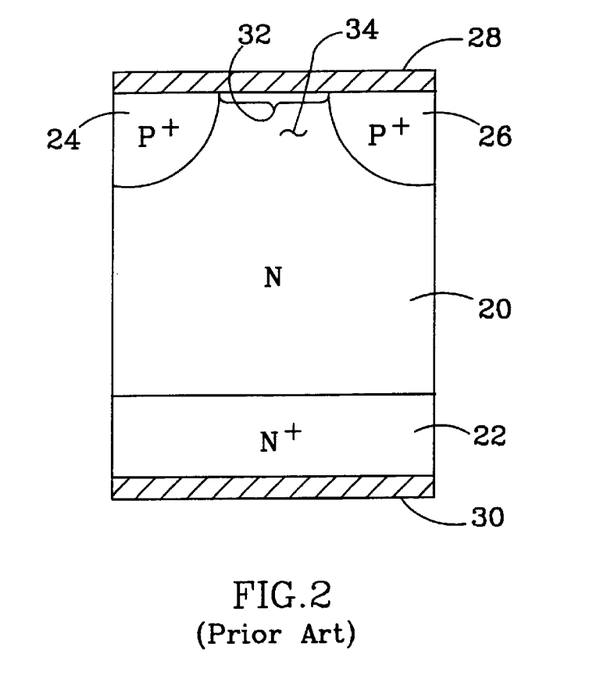
FIG. 2 is a sectional view of an MPS rectifier known in the prior art.

Another rectifier device used in high power applications is the "merged P-i-N/Schottky" (MPS) rectifier, shown in FIG. 2 and described in Baliga (ibid.) at pp. 187–192. As with the P-i-N rectifier, this device has an N-type drift region 20 on an N$^+$ region 22. However, instead of a continuous P$^+$ layer over the drift region, two physically separate P$^+$ regions 24, 26 are diffused into drift region 20. Metal layers 28 and 30 provide the rectifier's anode and cathode, respectively. The interface between the anode 28 and the lightly doped drift region 20 form a Schottky contact 32; the area under the Schottky contact is referred to herein as the Schottky region 34.

When forward-biased, P$^+$ regions 24 and 26 inject holes into drift region 20. This results in conductivity modulation of the drift region in a manner similar to the P-i-N rectifier, which reduces its resistance to current flow. The barrier height of the Schottky contact 32 is less than that of the structure's P$^+$-N junctions; if the Schottky region is sufficiently wide, a significant amount of current will flow through it, with the lower barrier height providing a lower $V_{FD}$ for the device. The MPS rectifier also provides an improved reverse recovery characteristic: the injection level required to reduce the resistance in series with the Schottky region is not as large as that observed in the P-i-N rectifier; consequently, the stored charge in the MPS recitifer is smaller than that found in the P-i-N rectifier.

The MPS rectifier has several shortcomings, however. When reverse-biased, the device's Schottky contact 32 is subjected to a strong electric field. If unprotected, the Schottky contact exhibits a "barrier height lowering effect", which allows a reverse current to leak through the device via the lowered barrier. This can be a countered by reducing the spacing between the P$^+$ regions, but the device then begins to resemble the P-i-N structure—increasing the forward voltage drop and losing some of the advantages provided by the Schottky region. Unfortunately, this spacing is difficult to control, due to the lateral diffusion that occurs when fabricating the device.

SUMMARY OF THE INVENTION

A rectifier device is presented that overcomes the problems noted above. The rectifier is particularly well-suited to high power switching applications, providing a high current density and reverse blocking voltage, along with a low forward voltage drop and superior reverse recovery characteristics.

The novel structure has an N$^-$ drift layer on an N$^+$ region. A pair of trenches are recessed into the drift layer opposite the N$^+$ region; the trenches are separated by a mesa region. Oxide side-walls line the outside of each trench. A shallow P$^+$ region extends from the bottom of each trench into the drift layer. The trenches each contain a conductive material that provides a conductive path between the top of the trench and its shallow P$^+$ region. The rectifier's anode is provided by a metal layer that contacts the conductive material in the two trenches and the mesa region; metal on the structure's N$^+$ region serves as the device's cathode.

The interface between the anode and the drift layer provides a Schottky contact. When forward-biased, the shallow P$^+$ regions inject holes into the drift region, lowering its resistance and allowing forward conduction through both the Schottky and P$^+$ regions. The Schottky contact's low barrier height gives the device a low forward voltage drop. When reversed-biased, depletion regions form around the shallow P$^+$ regions and the oxide side-walls and provide a potential barrier across the Schottky region which shields the Schottky contact, thereby providing a high reverse blocking voltage and greatly reducing reverse leakage current. The presence of the Schottky region also reduces the amount of stored charge that must be removed, further improving the device's reverse recovery performance.

The trench structures enable both the trench widths and the width of the mesa region to be precisely controlled, permitting the device's forward voltage drop and reverse recovery characteristics to be tailored to the demands of a particular application.

A number of such structures are fabricated in parallel to provide a desired current carrying capacity. Devices fabricated in this way have carried currents of 50 A with a reverse blocking voltage in excess of 1200 volts, on a die size of only 0.5 cm². These characteristics make the novel rectifier device well-suited for high power applications; for example, as the flyback diode across a transistor switch in a PWM motor control circuit.

Further features and advantages of the invention will be apparent to those skilled in the art from the following detailed description, taken together with the accompanying drawings.

DETAILED DESCRIPTION OF THE INVENTION

Figure 3:
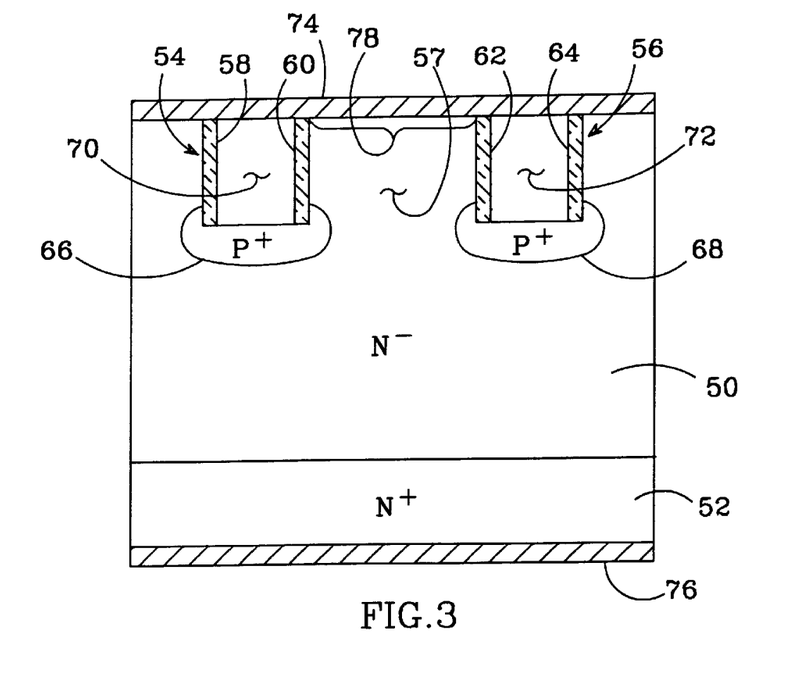
FIG. 3 is a sectional view of one embodiment of a rectifier per the present invention.

An exemplary embodiment of a rectifier device in accordance with the present invention is shown in FIG. 3. A N⁻ drift layer 50 of a desired thickness is on an N⁺ region 52. Recessed vertically into drift layer 50 opposite the N⁺ region are a pair of trenches 54, 56, which are separated by a mesa region 57. Each of the trenches has oxide side-walls 58, 60, 62, 64. As used herein, a trench is "recessed vertically" when its side-walls are approximately perpendicular to the top surface of the drift layer 50. At the bottom of each trench is a shallow P⁺ region 66, 68, and a conductive material 70, 72 is between the top of each trench and its respective P⁺ region. A metal layer 74 contacts the mesa region 57, as well as the side-walls 58, 60, 62, 64 and conductive materials 70, 72 of the two trenches 54, 56. Another metal layer 76 contacts N⁺ region 52.

The structure shown in FIG. 3 forms a rectifier, with metal layers 74 and 76 serving as anode and cathode, respectively. Voltage applied to anode 74 is conducted to the shallow P⁺ regions at the bottom of trenches 54 and 56 via their respective conductive materials 70 and 72. The interface between metal layer 74 and the mesa region 57 of drift layer 50 forms a Schottky contact 78.

Figure 4:
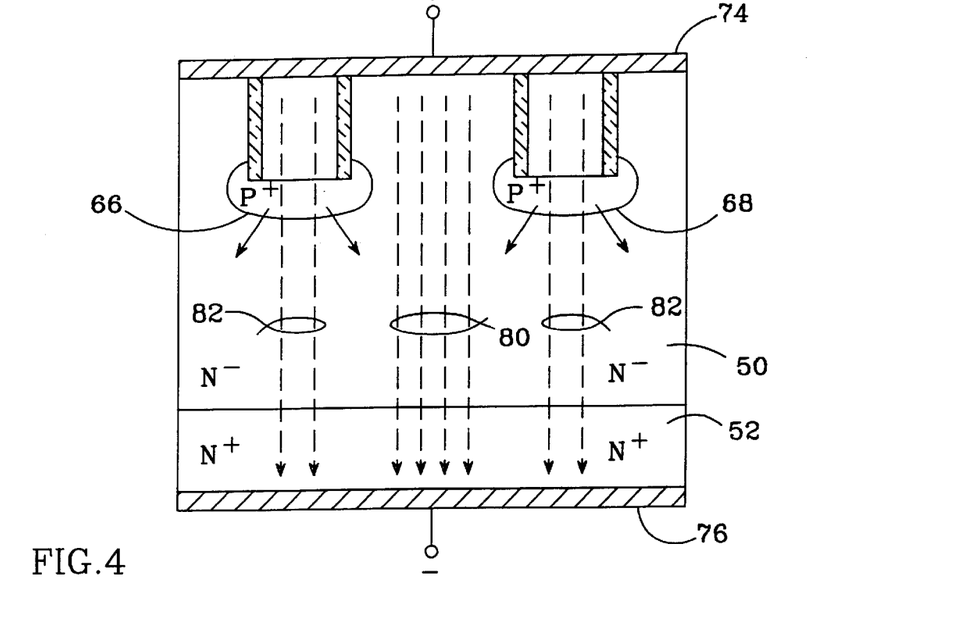
FIG. 4 is a sectional view of the rectifier of FIG. 3, illustrating its operation when forward-biased.

The operation of the rectifier when forward-biased, i.e., with a voltage applied to anode 74 that is positive with respect to the voltage applied to cathode 76, is illustrated in FIG. 4. The shallow P⁺ regions 66, 68 inject holes into the drift layer 50, which reduces its series resistance. As long as the separation between the two P⁺ regions is smaller than the ambipolar diffusion length of the device, there will be significant conductivity modulation under the Schottky contact 78. This greatly enhances the forward conduction in the Schottky region of the rectifier, and results in the majority of the forward current being transported from anode 74 to cathode 76 via the Schottky contact (current 80); the remainder of the foreward current (current 82) is conveyed from anode 74 to cathode 76 across the P⁺-N junctions. Because the barrier height of the Schottky contact is less than that of the P⁺-N junctions, the rectifier provides a low forward voltage drop $V_{FD}$.

Figure 5:
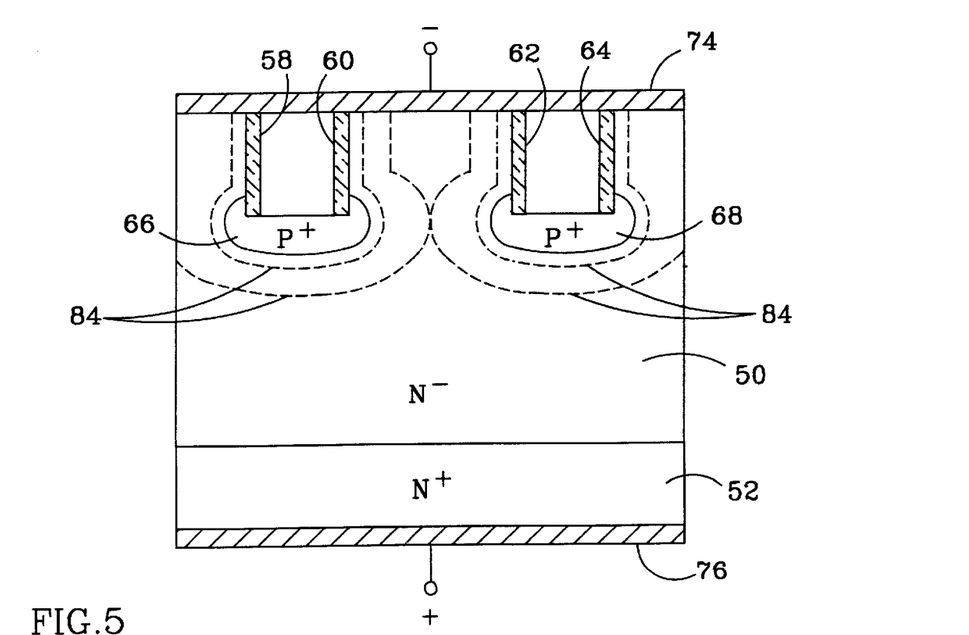
FIG. 5 is a sectional view of the rectifier of FIG. 3, illustrating its operation when reverse-biased.

The operation of the rectifier when reverse-biased, i.e., with the voltage on cathode 76 greater than that applied to anode 74, is illustrated in FIG. 5. The thickness and doping density of drift layer 50 determine the rectifier's reverse blocking voltage. As the voltage across the device falls below $V_{FD}$, depletion regions 84 begin to form around the buried P⁺ regions 66 and 68, as well as around the oxide side-walls 58, 60, 62, 64 of the trenches. As the depletion regions grow, they form a potential barrier under Schottky contact 78, which shields the contact from the high electric field imposed by the voltage across the device. This inhibits the barrier height lowering effect, and thus enables the device to achieve a very low reverse leakage current. As shown in FIG. 3, buried P⁺ region 66 extends around the bottom corners of oxide sidewalls 58 and 60, and buried P⁺ region 68 extends around the bottom corners of sidewalls 62 and 64, thereby protecting the corners from high peak electric fields when the device is reverse-biased.

Several important advantages are afforded by the device's novel structure. The oxide side-walls 58, 60, 62, 64 of trenches 54 and 56 prevent the diffusion of P-type dopant sideways, and the P⁺ regions at the bottom of the trenches are made shallow to reduce lateral diffusion. The factors combine to make possible the fabrication of well-defined and precisely located high aspect ratio P⁺ regions. This provides excellent control of the rectifier's Schottky/P⁺ ratio, i.e., the ratio between the area of the Schottky region to the area of the P⁺ regions, enabling its performance characteristics to be tailored to a particular application. Though a device employing non-vertically-recessed trenches, i.e., trenches having angled or curved side-walls, would provide some of the advantages described herein, it is preferred that the trenches be recessed vertically into drift layer 50, because this provides optimum control of a device's Schottky/P⁺ ratio.

Recessing the shallow P⁺ regions into drift layer 50 and below the Schottky contact, together with the oxide sidewalls, serves to make the voltage (typically expressed in eV) of the reverse-bias-induced potential barrier higher than that found in prior art devices such as the MPS rectifier, greatly improving its shielding effectiveness. Also, because minority carriers are injected only by the shallow $P^+$ regions, the concentration of holes at the P-border region (i.e., at the $P^+$-N interface) is less than it is for devices without a Schottky contact, such as the P-i-N rectifier. This reduces the amount of stored charge that must be removed when the device is reverse-biased, which reduces the amplitude of the rectifier'speak reverse current $I_{RP}$ and makes its reverse recovery characteristic soft rather than snappy; both of these consequences of the novel structure serve to reduce the stress on components the rectifier is being used with, such as the switching transistors of a PWM motor control circuit. Lowering the amount of stored charge that must be removed also allows the rectifier to be switched more quickly between forward conduction and reverse blocking states. The doping level of the shallow $P^+$ regions is preferably at least $1\times10^{18}$ carriers per $cm^3$.

Referring back to FIG. 3, the conductive materials 70 and 72 are preferably polysilicon, heavily doped with acceptors to provide low resistance conductive paths between metal layer 74 and shallow $P^+$ regions 66 and 68. Polysilicon is preferred because it easily fills the trenches, but other materials that can fill the trenches and provide good conductivity could also be used.

As noted above, the novel structure provides a low reverse leakage current because of the higher potential barrier provided by the recessed $P^+$ areas and oxide side-walls. The trenches preferably have a depth of between about 1 $\mu$m and 3 $\mu$m. Simulation results have shown that the reverse leakage current decreases with the depth of the trenches, with a depth of about 3 $\mu$m providing a very low reverse leakage current (100 nA for a rectifier with an area of 0.5 $cm^2$) that is about equal to that provided by a P-i-N rectifier. The width of each of the trenches is preferably about equal, and the width of the mesa region is preferably about twice as wide as that of a trench. In a preferred embodiment, the width of each trench is about 2 $\mu$m and the width of the mesa region is about 4 $\mu$m.

The shallow $P^+$ regions are preferably only about 0.5 $\mu$m deep, which provides an adequate supply of minority carriers when forward-biased while limiting lateral diffusion.

Figure 6:
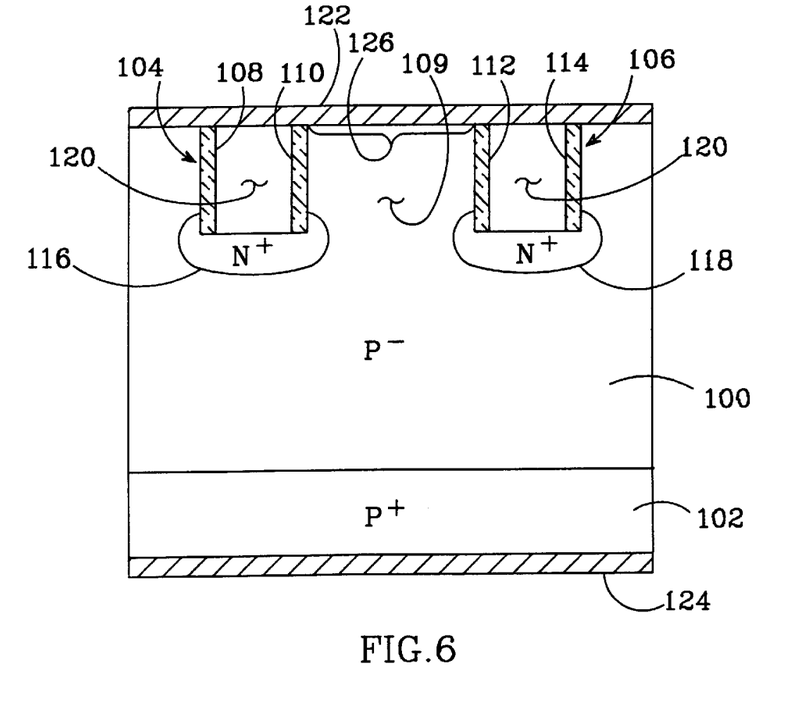
FIG. 6 is a sectional view of an alternative embodiment of a rectifier per the present invention.

The present rectifier is not limited to the structure shown in FIG. 3. An alternative embodiment is shown in FIG. 6, in which each of the materials has been swapped with its opposite polarity counterpart. Here, a $P^-$ drift layer 100 is on a $P^+$ region 102, and a pair of trenches 104, 106 are vertically recessed into the drift layer opposite the $P^+$ region; the trenches are separated by a mesa region 109. Each trench has oxide side-walls 108, 110 and 112, 114, a respective shallow $N^+$ region 116, 118 at its bottom, and is filled with a conductive material 120—preferably polysilicon which has been heavily doped with donors; each $N^+$ region extends around the bottom corners of its respective sidewalls. A metal layer 122 contacts mesa region 109 and the side-walls 108, 110, 112, 114 and conductive material 120 in each trench, and another metal layer 124 contacts the $P^+$ region. The interface between metal layer 122 and mesa region 109 forms a Schottky contact 126. In this embodiment, metal layer 124 serves as the rectifier's anode and metal layer 122 serves as its cathode. Operation of the device is analogous to that of FIG. 3, except that in this embodiment, electrons are the minority carriers rather than holes, and the direction of forward conduction is reversed, with current flowing from anode 124 to cathode 122 via Schottky contact 126 and $N^+$ regions 116 and 118.

Figure 7:
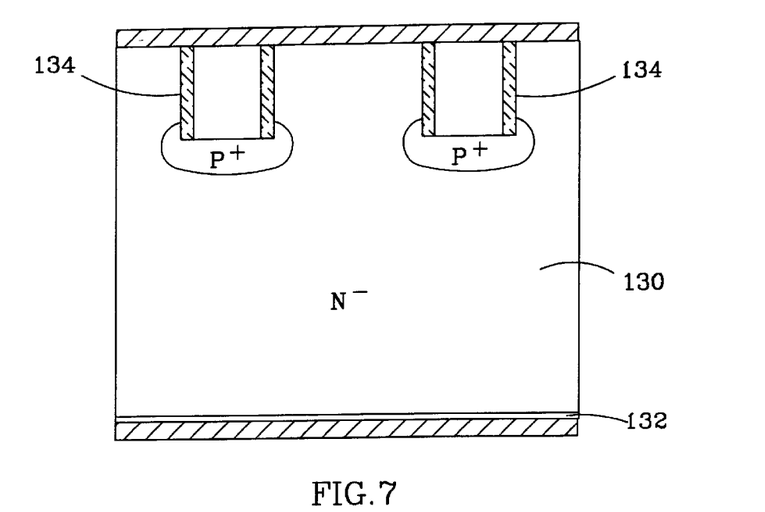
FIG. 7 is a sectional view of another alternative embodiment of a rectifier per the present invention.

The rectifier can be fabricated on punch-through wafers (EPI), in which the drift layer is an epitaxial layer grown to a desired thickness on a bulk substrate material (as in FIG. 3, with epitaxial drift layer 50 on $N^+$ bulk substrate 52), or on non-punch-through (NPT) wafers. An exemplary embodiment using an NPT wafer is shown in FIG. 7. Here, the $N^-$ drift region 130 is a bulk substrate material, and the $N^+$ region 132 is a very thin layer (0.5 $\mu$m or less) of a material such as phosphorus or arsenic which has been implanted from the backside to provide a low resistance ohmic contact; the rest of the structure is similar to that shown in FIG. 3, with a pair of trenches 134 with oxide side-walls and shallow $P^+$ regions recessed into drift layer 130.

Several factors should be considered when determining which wafer-type to use. EPI wafers are more expensive that NPT wafers, but because the $N^-$ epitaxial layer has a controlled thickness and doping concentration, they offer a lower forward voltage drop. An NPT-based device will have a lower electron injection efficiency than an EPI-based device, and this property can be used to manipulate the stored charge and provide a better reverse recovery characteristic. In contrast, lifetime control is used to adjust the stored charge in an EPI-based device.

Simulation results indicate that the present rectifier can accommodate current densities in excess of 100 $A/cm^2$. To provide a high power rectifier, the structures of FIGS. 3–7 are repeated across a die having an area sufficient to provide the necessary current carrying capacity. This is illustrated in the cross-sectional view shown in FIG. 8 of an exemplary high power rectifier. A die 150 has an $N^-$ drift layer 152 on an $N^+$ layer 154, sandwiched between metal layers 156 and 158; each of these layers runs approximately the full length and width of the die. A number of trench structures 160 are spaced periodically across the die, each of which is similar to the trenches shown in FIG. 3—filled with a conductive material 162 and having oxide side-walls 164 and a shallow $P^+$ region 166 at its bottom. The area from the midpoint of one trench structure to the midpoint of an adjacent trench structure is referred to as a "cell". The halves of the adjacent trenches which are within each cell function as described above, injecting holes into drift layer 152 when the device is forward-biased, inducing conductivity modulation under each Schottky contact and a corresponding forward current through the Schottky regions. When the device is reversed-biased, depletion regions form around each trench structure to form potential barriers under each Schottky contact.

The trench structures may be arrayed across the die in a wide variety of ways. One arrangement is illustrated in FIG. 9, which is a plan view that corresponds with the cross-sectional view of FIG. 8 (metal layers 156, 158 and N+layer 154 not shown for clarity). The trench structures 160 form channels that run the length of the die 150, and are spaced periodically across its width.

Figure 8:
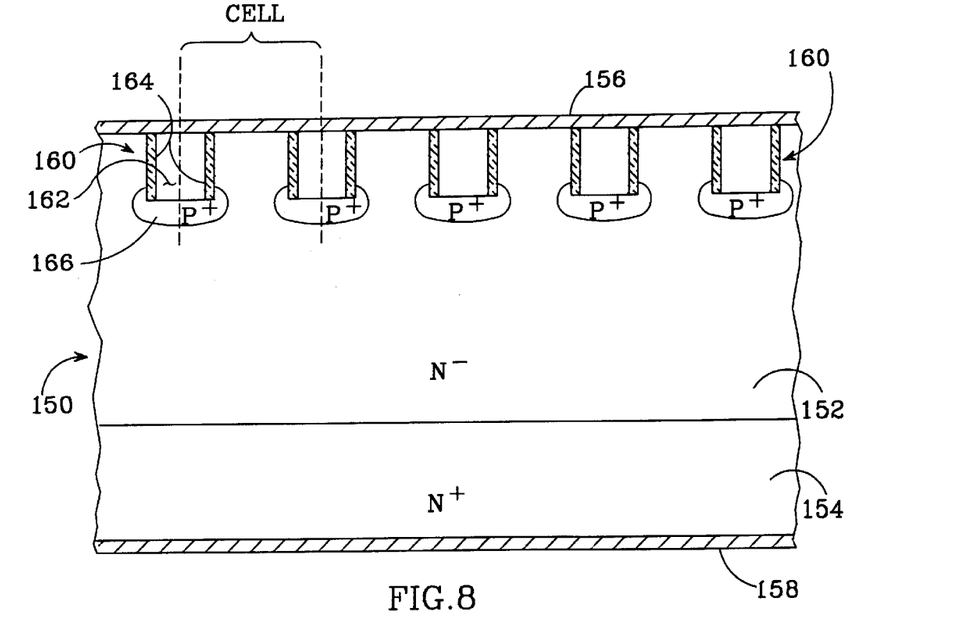
FIG. 8 is a cross-sectional view of a multiple-cell implementation of a rectifier per the present invention, cut along section lines 8—8 in FIGS. 9 and 10.
Figure 9:
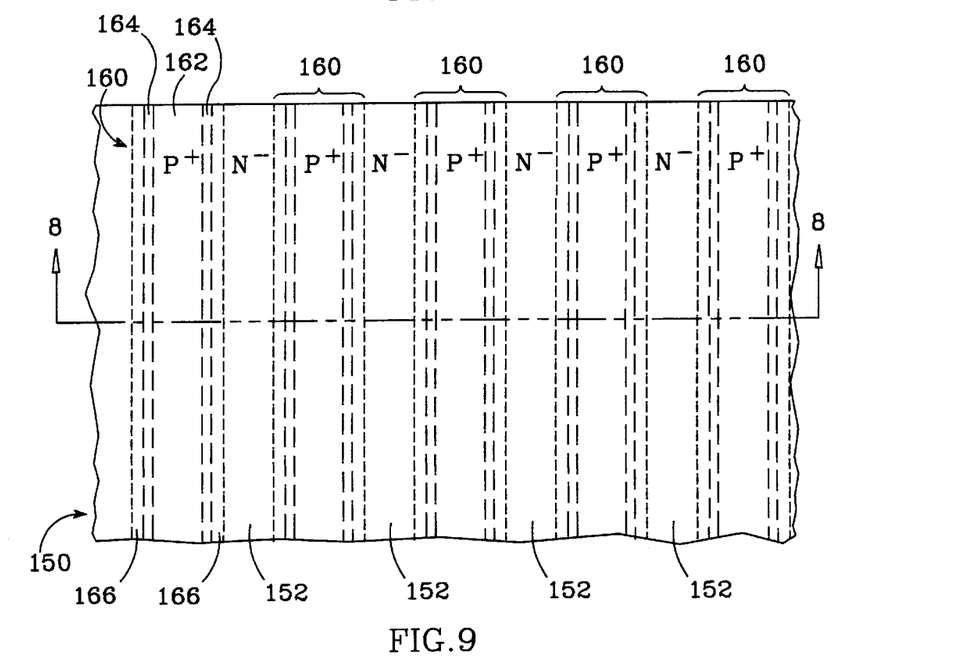
FIG. 9 is a plan view of one embodiment of a multiple-cell implementation of a rectifier per the present invention.
Figure 10:
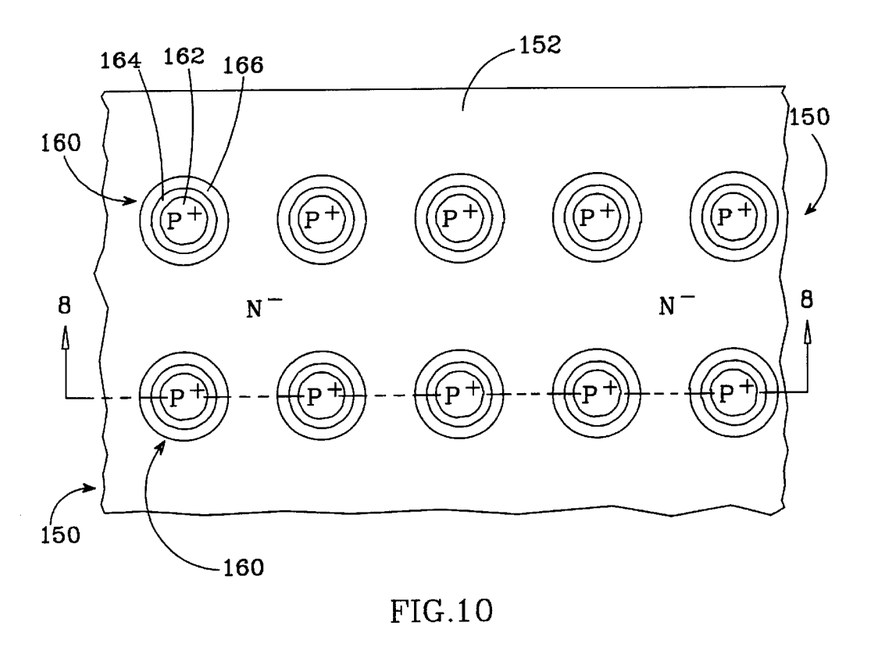
FIG. 10 is a plan view of another embodiment of a multiple-cell implementation of a rectifier per the present invention.

Another possible trench structure arrangement is shown in FIG. 10, which also corresponds with the cross-sectional view of FIG. 8. Here, the trenches 160 are cylindrical in shape, and are spaced periodically within the die 150. Note that an alternative arrangement to that shown in FIG. 10 is also possible, in which the $P^+$ regions and the Schottky regions are reversed. The Schottky contacts could be circular in shape, surrounded by cylindrical oxide side-walls, and spaced periodically within the die 150, with the $P^+$ regions recessed in the area between the Schottky contacts.

The trench structure arrays shown in FIGS. 8–10 are merely exemplary; many other possible trench shapes and arrangements are possible. It is recommended that square-shaped trenches be avoided, because the high peak fields that appear at the trench corners can result in the premature breakdown of the device.

Mesa region and trench widths are design parameters that have a significant impact on rectifier performance. Both widths affect the breakdown voltage of the rectifier (with a narrower mesa region or a wider trench increasing breakdown voltage), and the Schottky/P+ ratio affects $V_{FD}$ and the reverse recovery charge $Q_n$.

Figure 11:
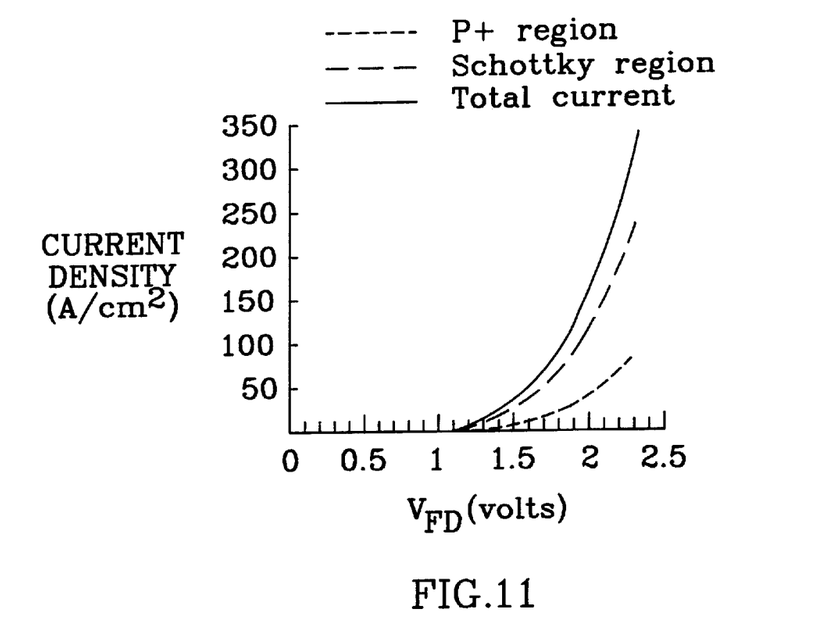
FIG. 11 is a simulated plot of forward voltage vs. current density for a rectifier per the present invention.

A simulated plot of $V_{FD}$ versus current density is shown in FIG. 11 for a rectifier having the structure shown in FIG. 3, with a mesa region width of about 4 $\mu$m and a trench width of about 2 $\mu$m. This results in a structure in which the Schottky region and the trenches occupy about 67% and 33% of the device area, respectively. As seen in FIG. 11, the current density in the P+ regions (short dashes) is much lower than that found in the Schottky region (long dashes). The solid line shows the total current density through the device.

Figure 12:
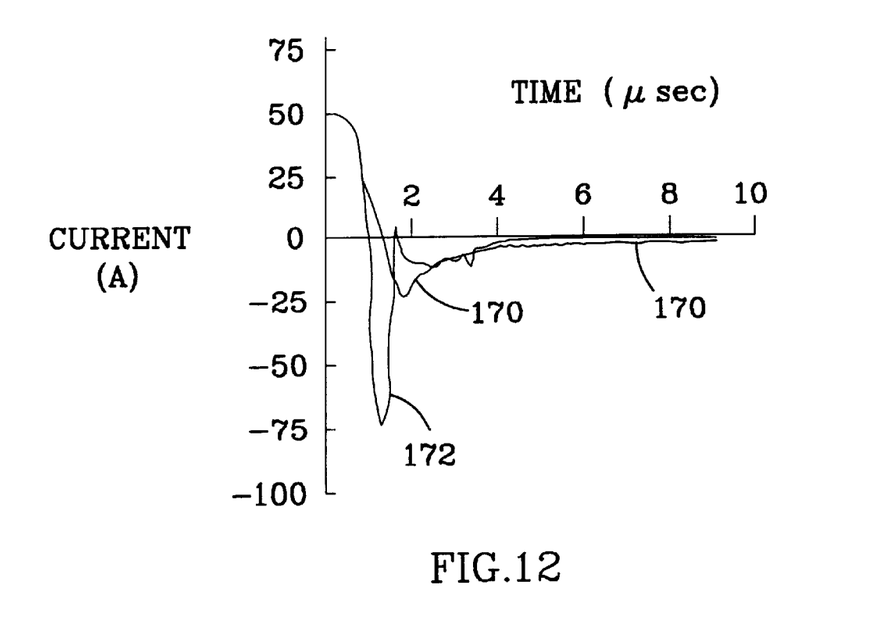
FIG. 12 is a graph plotting the reverse recovery characteristics of a P-i-N rectifier and a rectifier per the present invention.

A plot of current flow versus time for a rectifier per the present invention (trace "170") and a commercial "fast recovery" P-i-N rectifier (trace "172") is shown in FIG. 12, showing what happens to current flow when the rectifiers are turned off while carrying a forward current of 50 A. Though the quantity of stored charge $Q_n$ is about the same for the two devices ($Q_n$(invention)≅5.5 $\mu$C; $Q_n$(P-i-N)≅5.2 $\mu$C), the new rectifier has a much smaller peak reverse recovery current $I_{RP}$ (~27 A vs. ~74 A). In addition, the new rectifier provides a soft recovery characteristic, as opposed to the P-i-N rectifier's snappy recovery characteristic. The lower $I_{RP}$ and soft recovery help to reduce the stress on associated components subjected to the current through the rectifier.

Figure 13:
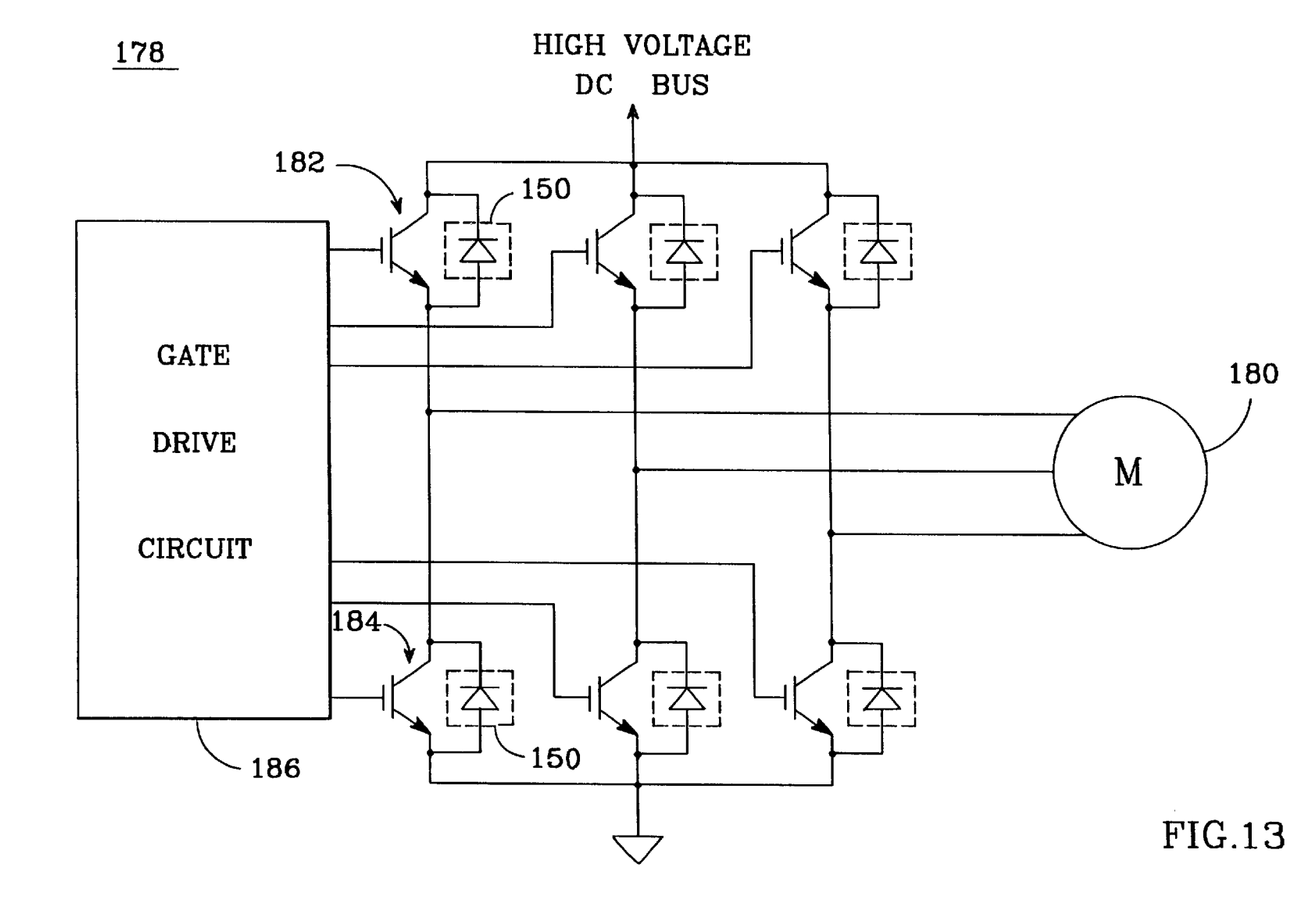
FIG. 13 is a schematic diagram of totem-pole switch circuit employing a rectifier per the present invention.

One application of a rectifier per the present invention is illustrated in FIG. 13. As described in J. Baliga (ibid.) at p. 575–577, a PWM motor control circuit 178 provides variable frequency AC power to a 3-phase AC motor 180 using six switching transistors and six flyback diodes. Each switch is made from two transistors connected in a totem-pole configuration: one switch (typical of all the switches), is made from a pair of transistors 182, 184 connected in series between a high voltage DC bus and ground, with a flyback diode 150 per the present invention connected across each transistor. The switching transistors are driven by a gate drive circuit 186, which regulates power to the motor by adjusting the time duration for the on and off states of each switch. In a motor control circuit application, insulated-gate bipolar transistors (IGBTs) are typically used for the switching transistors, due to their high reverse blocking voltage and excellent switching characteristics, and because they do not require a snubber circuit. Rectifiers 150 per the present invention are well-suited for use in the motor control circuit, due to their superior forward voltage drop, reverse recovery, and reverse blocking characteristics. These factors combine to improve the efficiency of the motor control circuit, while reducing the stress on the switching transistors.

The high power rectifier is fabricated using conventional means well-known to those in the art of semiconductor fabrication. Though the device's trench structures require processing steps that are not necessary when fabricating other rectifier types, such as a P-i-N or MPS rectifier, the additional fabrication complexity is offset by the greatly improved performance of the device when used in high power applications.

While particular embodiments of the invention have been shown and described, numerous variations and alternate embodiments will occur to those skilled in the art. Accordingly, it is intended that the invention be limited only in terms of the appended claims.

I claim:

1. A rectifier device, comprising:
   an N+ layer,
   a first layer of metal on said N+ layer providing a first connection point for said device,
   an N− drift layer on said N+ layer opposite said first layer of metal,
   a first pair of trenches recessed vertically into said drift layer opposite said N+ layer, said trenches separated by a mesa region,
   a layer of oxide lining the sides of each of said trenches to form oxide side-walls in each of said trenches,
   a respective shallow P+ region in said N− drift layer at the bottom of each of said trenches which extends around the corners at the bottoms of said sidewalls to protect said corners from high peak electric fields when said device is reverse-biased, the separation between said shallow P+ regions being less than the ambipolar diffusion length of the device,
   a conductive material in each of said trenches for conducting current from the top of each trench to its respective shallow P+ region, said conductive material comprising polysilicon which has been heavily-doped with acceptors, and
   a second layer of metal contacting said mesa region, said conductive material, and said oxide side-walls, said second layer of metal forming a Schottky contact at its interface with said mesa region, said second layer of metal providing a second connection point for said device,
   said N+ layer, said N− drift layer, said first and second layers of metal, said first pair of trenches, said layer of oxide, said respective shallow P+ regions, and said conductive material arranged such that a voltage applied across said connection points which forward-biases the device produces conductivity modulation in said drift region allowing current to flow from said second to said first connection point via said Schottky contact and said shallow P+ regions, and a voltage applied across said connection points which reverse-biases the device produces depletion regions alongside said side-walls and around said shallow P+ regions which provide a potential barrier that shields said Schottky contact from a high electrical field and thereby reduces reverse leakage current.

2. The rectifier device of claim 1, wherein the doping level of said shallow P+ regions is at least $1 \times 10^{18}$ carriers per $cm^3$.

3. The rectifier device of claim 1, wherein said N+ layer is a bulk substrate material and said N− drift layer is an epitaxial layer grown on said N+ layer.

4. The rectifier device of claim 1, wherein said N− drift layer is a bulk substrate material and said N+ layer is implanted into the backside of said N− layer.

5. The rectifier device of claim 1, wherein the depth of each of said trenches is between about 1 $\mu$m and 3 $\mu$m.

6. The rectifier device of claim 1, wherein said shallow P+ regions are about 0.5 $\mu$m thick to limit lateral diffusion.

7. The rectifier device of claim 1, wherein the width of each of said trenches is about equal, and the width of said mesa region is about twice as wide as that of a trench.

8. The rectifier device of claim 7, wherein the width of each of said trenches is about 2 $\mu$m and the width of said mesa region is about 4 $\mu$m.

9. The rectifier device of claim 1, wherein the structure between the vertical midpoints of each of said trenches comprise a rectifier cell, further comprising a plurality of additional trenches recessed in said drift region and spaced periodically within a given area with said first pair of trenches, each of said additional trenches having oxide side-walls, a shallow $P^+$ region at its bottom, and a conductive material for conducting current from the top of the trench to its shallow $P^+$ region, the conductive material and side-walls in each of said additional trenches contacting said second layer of metal, each of said additional trenches forming an additional one of said rectifier cells, said additional rectifier cells increasing the current carrying capacity of said rectifier device when said device is forward-biased.

10. A rectifier device, comprising:

an $P^+$ layer, a first layer of metal on said $P^+$ layer providing a first connection point for said device, an $P^-$ drift layer on said $P^+$ layer, a pair of trenches recessed vertically into said $P^-$ layer opposite said $P^+$ layer, said trenches separated by a mesa region, a layer of oxide lining the sides of each of said trenches to form oxide side-walls in each of said trenches, a respective shallow $N^+$ region in said $P^-$ drift layer at the bottom of each of said trenches which extends around the corners at the bottoms of said sidewalls to protect said corners from high peak electric fields when said device is reverse-biased, the separation between said shallow $N^+$ regions being less than the ambipolar diffusion length of the device, a conductive material in each of said trenches for conducting current from the top of each trench to its respective shallow $N^+$ region, said conductive material comprising polysilicon which has been heavily-doped with donors, and a second layer of metal contacting said mesa region, said conductive material, and said oxide side-walls, said second layer of metal forming a Schottky contact at its interface with said mesa region, said second layer of metal providing a second connection point for said device, said $P^+$ layer, said $P^-$ drift layer, said first and second layers of metal, said first pair of trenches, said layer of oxide, said respective shallow $N^+$ regions, and said conductive material arranged such that a voltage applied across said connection points which forward-biases the device produces conductivity modulation in said drift region allowing current to flow from said first to said second connection point via said Schottky contact and said shallow $N^+$ regions, and a voltage applied across said connection points which reverse-biases the device produces depletion regions in said mesa region alongside said side-walls and around said $N^+$ regions which provide a potential barrier that shields said Schottky contact from a high electrical field and thereby reduces reverse leakage current.

11. A high power rectifier device, comprising:

an $N^+$ layer, a first layer of metal on said $N^+$ layer providing a first connection point for said device, an $N^-$ drift layer on said $N^+$ layer, a plurality of trenches recessed vertically into and spaced periodically through said drift layer opposite said $N^+$ layer, every pair of said trenches separated by a respective mesa region, a layer of oxide lining the sides of each of said trenches to form oxide side-walls in each of said trenches, a respective shallow $P^+$ region in said $N^-$ drift layer at the bottom of each of said trenches which extends around the corners at the bottoms of said sidewalls to protect said corners from high peak electric fields when said device is reverse-biased, the separation between said shallow $P^+$ regions being less than the ambipolar diffusion length of the device, a conductive material in each of said trenches for conducting current from the top of each trench to its respective shallow $P^+$ region, said conductive material comprising polysilicon which has been heavily-doped with acceptors, and a second layer of metal contacting each of said mesa regions, and the side-walls and the conductive material in each of said trenches, said second layer of metal forming Schottky contacts where it contacts said mesa regions, said second layer of metal providing a second connection point for said device, said $N^+$ layer, said $N^-$ drift layer, said first and second layers of metal, said plurality of trenches, said layer of oxide, said respective shallow $P^+$ regions, and said conductive material arranged such that a voltage applied across said connection points which forward-biases the device produces conductivity modulation in said drift region allowing current to flow from said second to said first connection point via said Schottky contacts and said shallow $P^+$ regions, and a voltage applied across said connection points which reverse-biases the device produces depletion regions in said mesa regions alongside said side-walls and around said $P^+$ regions which provide a potential barrier that shields said Schottky contacts from a high electrical field and thereby reduce reverse leakage current.

12. The high power rectifier device of claim 11, wherein said device resides on a die in which said drift layer, said $N^+$ layer and said first and said second metal layers run the length and width of said die.

13. The high power rectifier device of claim 12, wherein each of said trenches is a channel which runs the length of said die and said trenches are spaced periodically across the width of said die.

14. The high power rectifier device of claim 12, wherein each of said trenches is approximately cylindrical about a vertical axis, said trenches spaced periodically within said die.

15. The high power rectifier device of claim 12, wherein said $N^+$ layer is a bulk substrate material and said $N^-$ drift layer is an epitaxial layer grown to a desired thickness on said $N^+$ layer.

16. The high power rectifier device of claim 12, wherein said $N^-$ layer is a bulk substrate material and said $N^+$ layer is implanted into the backside of said $N^-$ layer and has a thickness of less than about 0.5 $\mu$m.

17. The high power rectifier device of claim 11, wherein the thickness of said drift layer is sufficient to provide a reverse blocking voltage for said device of at least 1200 volts.

18. The high power device of claim 11, wherein the surface area of said die is about 0.5 cm$^2$ and said rectifier device can accommodate a current of at least 50 A when forward-biased.

* * * * *